US 6,633,488 B1

(12) United States Patent
Morita

(10) Patent No.: US 6,633,488 B1
(45) Date of Patent: Oct. 14, 2003

(54) PRINTED CIRCUIT BOARD UNIT WITH CORRECTION MEMBER

(75) Inventor: Yoshihiro Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/452,060

(22) Filed: Nov. 30, 1999

(30) Foreign Application Priority Data

Feb. 25, 1999 (JP) ............................................. 11-048308

(51) Int. Cl.[7] ................................................. H05K 7/14
(52) U.S. Cl. ........................ 361/753; 361/752; 361/801; 211/41.17
(58) Field of Search ................................. 361/752, 753, 361/720, 758, 759, 801, 825; 211/41.17

(56) References Cited

U.S. PATENT DOCUMENTS

| | | | | |
|---|---|---|---|---|
| 4,151,547 A | * | 4/1979 | Rhoades et al. ............ | 165/185 |
| 4,441,140 A | * | 4/1984 | Richard ..................... | 361/720 |
| 4,979,074 A | * | 12/1990 | Morley et al. .............. | 361/720 |
| 5,002,715 A | * | 3/1991 | Grapes et al. .............. | 264/162 |
| 5,016,139 A | * | 5/1991 | Stopa et al. ................ | 361/720 |
| 5,172,755 A | * | 12/1992 | Samarov ..................... | 165/80.3 |
| 5,671,126 A | * | 9/1997 | Verding et al. ............. | 361/736 |
| 5,883,782 A | * | 3/1999 | Thurston et al. ............ | 364/704 |
| 5,972,459 A | * | 10/1999 | Kawakubo et al. ......... | 428/64.1 |
| 5,986,217 A | * | 11/1999 | Strum ........................ | 174/254 |

* cited by examiner

Primary Examiner—Jayprakash N. Gandhi
(74) Attorney, Agent, or Firm—Sheppard Mullin Richter & Hampton LLP

(57) ABSTRACT

A printed circuit board unit comprising a printed circuit board and a correction member. The correction member contacts the printed circuit board at a pair of contact points and support points arranged between the contact points. The support points are defined at a position withdrawing from a plane including the contact points. Screws serve to urge the printed circuit board against the correction member. The correction member is adapted to generate an intentional warp or bend. Such warp serves to correct or modify the curvature of the front surface of the printed circuit board. The front surface of the printed circuit board can be maintained flat.

17 Claims, 8 Drawing Sheets

PRINTED CIRCUIT BOARD UNIT WITH CORRECTION MEMBER

BACKGROUND OF THE INVENTION

1. Field of the Invention

The present invention relates in general to a printed circuit board on which electronic components such as chips are mounted.

2. Description of the Prior Art

When an electronic component is mounted on a printed circuit board, soldering process such as reflowing is often employed in the surface mount technology. In the process of soldering, the printed circuit board is subjected to a high temperature atmosphere of 200–230 Celsius degrees. When the printed circuit board is cooled after the process of soldering, the printed circuit board is subjected to shrinkage scaled by a thermal expansion coefficient. The printed circuit board suffers from a smaller shrinkage at the front surface, on which electronic components are mounted, and a larger shrinkage at the back surface. Such uneven or irregular shrinkage induces a warp of the printed circuit board. The warp sometimes causes the mounted electronic components to be torn apart from the printed circuit board. The warp also sometimes serves to generate a larger stress in the input/output pins of the electronic components, which may deteriorate the durability of the input/output pins, namely, the mounted electronic components. Heretofore, a high rigidity linear or planar member of metallic material is often coupled to the back surface of the printed circuit board so as to cancel the warp. When the printed circuit board is urged against the linear or planar member, the front surface of the printed circuit board can be flattened.

Large-sized computers such as supercomputers and main frames in general employ a large-sized print circuit board on which electronic components such as MCMs (multichip modules) and memory modules are mounted. The large-sized printed circuit board tends to deform because of its size, so that it is difficult to keep the front surface of the large-sized printed circuit board plane or flat. The input/output pins of electronic components hardly contact the input/output pads on the front surface of the large-sized printed circuit board when the electronic components are to be mounted on the large-sized printed circuit board.

In particular, a printed circuit board comprising multilayered copper printed circuit patterns usually suffers from reduction in thickness at the periphery of the printed circuit board. When the copper printed circuit patterns or films are laminated or superposed in fabricating the printed circuit board, a fluid resin material often leaks out at the periphery of the copper films, although the resin material is designed to stay between the copper films. Such leakage causes reduction in thickness of the printed circuit board. Moreover, the reduction is gradually intensified toward the periphery. Accordingly, a curved surface is formed at the front and back surfaces of the printed circuit board so as to swell at the central area of the surfaces. If the aforementioned linear or planar member is coupled to the printed circuit board at the curved back surface, the curvature of the front surface may be intensified, so that some of the input/output pins of the electronic components cannot at all touch the input/output pads on the front surface of the printed circuit board.

SUMMARY OF THE INVENITON

It is accordingly an object of the present invention to provide a printed circuit board reliably achieving electric connection to electronic components mounted thereon.

According to a first aspect of the present invention, there is provided a printed circuit board unit comprising: a printed circuit board; and a correction member contacting a surface of the printed circuit board at least three of support points arranged along a curved surface.

In addition, according to a second aspect of the present invention, there is provided a printed circuit board unit comprising: a printed circuit board; and a correction member defining a support point arranged between a pair of contact points, contacting a surface of the printed circuit board, at a position withdrawing from a plane including the contact points so as to contact the surface of the printed circuit board.

The correction members of the inventions are adapted to generate an intentional warp or bend of the printed circuit board. Such warp serves to correct or modify the curvature of the front surface of the printed circuit board. The front surface of the printed circuit board can be maintained flat. Electric connection can reliably be established between the printed circuit board and electronic components such as MCMs (multichip modules) to be mounted on the printed circuit board.

The printed circuit board unit may further comprise a coupler provided between the printed circuit board and the correction member so as to cause deformation of the printed circuit board. The coupler serves to keep urging the printed circuit board against the correction member, to that the aforementioned warp or deformation of the printed circuit board can be maintained. Accordingly, the correction member is required to have a rigidity enough to maintain its shape when the member is coupled to the printed circuit board by the coupler.

Here, the distance between the support point and the plane is preferably set to reflect the amount of shift generated at the support point when the printed circuit board and the correction member are supported at periphery in a horizontal attitude. In general, the printed circuit board is often supported at the periphery or opposite ends in a horizontal attitude when the electronic components are being mounted on the printed circuit board. A warp is generated in the printed circuit board due to the gravity of the electronic components mounted on the printed circuit board as well as the gravity of the printed circuit board itself. The aforementioned distance may serve to cancel such warp caused by the gravity. A flat surface can be maintained on the printed circuit board so as to completely receive the electronic components.

It is preferable that the correction member contacts a back surface of the printed circuit board at the contact and support points so as to correct the curvature of the front surface of the printed circuit board. The front surface can be flattened to receive electronic components. The correction member hardly hinders removal or exchange of the mounted electronic components. The maintenance of the electronic components can easily be achieved.

In this case, it is preferable that the distance measured from the support point and the plane is set to reflect a difference between a thickness of the printed circuit board at the support point and a thickness of the printed circuit board at the contact point. Such distance serves to correct or cancel the curvature of the front surface even when the curvature is caused by the variation in thickness of the printed circuit board.

The correction member can be formed into any shape or any structure as long as enough rigidity is established. For example, the correction member may be formed into a frame. In any event, the support point may be defined along a curved surface formed on the correction member or at an edge of a step formed on the correction member.

Furthermore, the correction member may comprise a main body with a flat surface opposed to the printed circuit board, and a filler interposed between the main body and the printed circuit board so as to induce a bend of the printed circuit board. Such arrangement allows employment of a conventional linear or planar member as the main body. Accordingly, the surface of the printed circuit board can be flattened without inducing a serious change in the design.

The material of the correction member is preferably selected to reflect a thermal expansion coefficient of the printed circuit board to be coupled to the member. For example, if a smaller difference can be found between the thermal expansion coefficient of the printed circuit board and the thermal expansion coefficient of the correction member, a warp can be restrained to the utmost in the printed circuit board even when the printed circuit board with the correction member is subjected to a high temperature atmosphere. When the printed circuit board is formed by impregnating glass fibers with fluid epoxy resin or polyimide, a stainless steel is preferably selected for the material of the correction member.

The aforementioned correction member may be integrated with a power supply member serving to supply an electric voltage to electronic components mounted on the printed circuit board, or with a connector for coupling an electronic component with the printed circuit board. The integration of this kind may serve to omit a space peculiar to an independent correction member.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
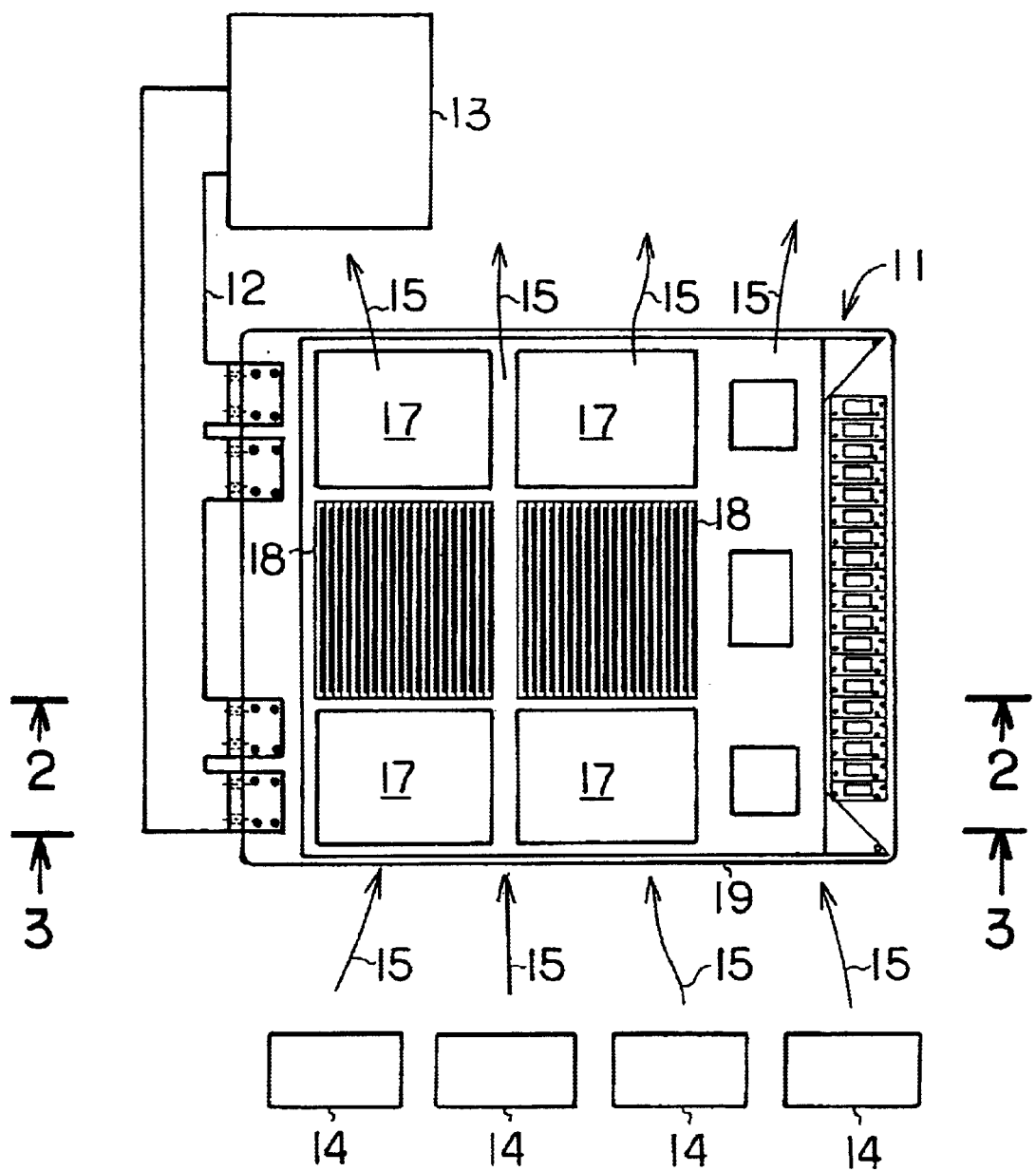
FIG. 1 is a plan view schematically illustrating the interior structure of a large-sized computer.
Figure 2:
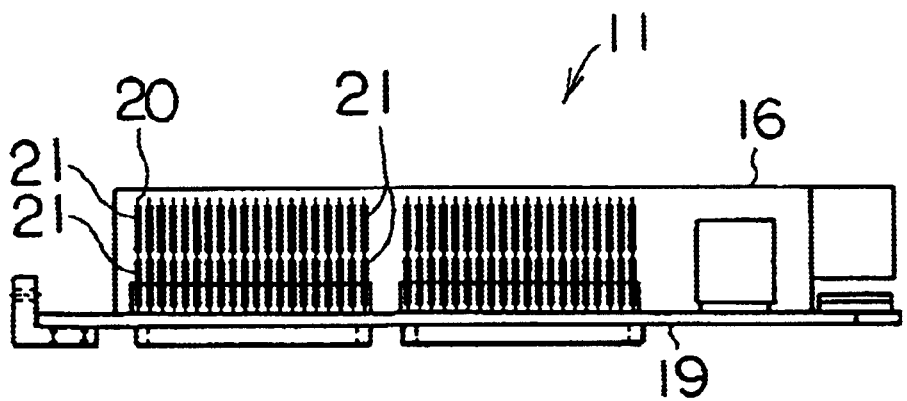
FIG. 2 is a sectional view taken along the line 2—2 in FIG. 1.

FIG. 1 schematically illustrates the interior structure of a large-sized computer. The computer comprises a motherboard 11, according to a first embodiment of the present invention, for data processing and a power supply unit 13 assembled within a housing. The power supply unit 13 is adapted to supply an electric power to the motherboard 11 through a power supply plate 12. A fan 14 is designed to generate airflow 15 when the motherboard 11 operates for data processing in response to the supply of the electric power. The airflow 15 is adapted to cool the operating motherboard 11. Referring also to FIG. 2, a hood 16 is attached to the motherboard 11 for guiding the airflow 15 from the fan 14 along the surface of the motherboard The motherboard 11 comprises a printed circuit board unit 19 and electronic components such as MCMs (multichip modules) 17, memory modules 18, and the like, mounted on the printed circuit board unit 19. Copper printed circuit patterns, not shown, integrated in the printed circuit board unit 19 serve to establish electric connections between the MCMs 17 and the memory modules 18. The individual MCMs 17 may behave as one or more central processing unit (CPU). Moreover, four MCMs 17 in combination may behave as a single CPU. As is apparent from FIG. 2, each of the memory modules 18 comprises, for example, a substrate 20 standing upright on the printed circuit board unit 19, and a plurality of memory chips 21 mounted on the front and back surfaces of the substrate 20.

Figure 3:
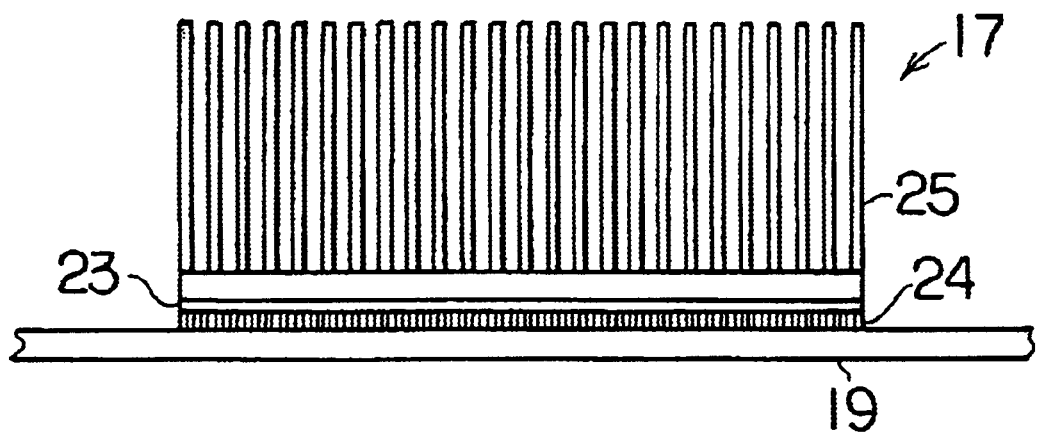
FIG. 3 is an enlarged partial sectional view taken along the line 3—3 in FIG. 1.

Each of the MCMs 17 comprises, as shown in FIG. 3, a ceramic printed circuit board 23 on which LSI (large-scale integration) chips are mounted, and a plurality of input/output pins 24 protruding toward the printed circuit board unit 19 from the lower surface of the ceramic printed circuit board 23 at the periphery of the respective LSI chips. The respective input/output pins 24 are soldered on corresponding input/output pads, not shown, arranged on the printed circuit board unit 19. A radiation fin 25 is attached at the back surface of the ceramic printed circuit board 23 so as to promote radiation of heat generated in the MCM 17.

Figure 4:
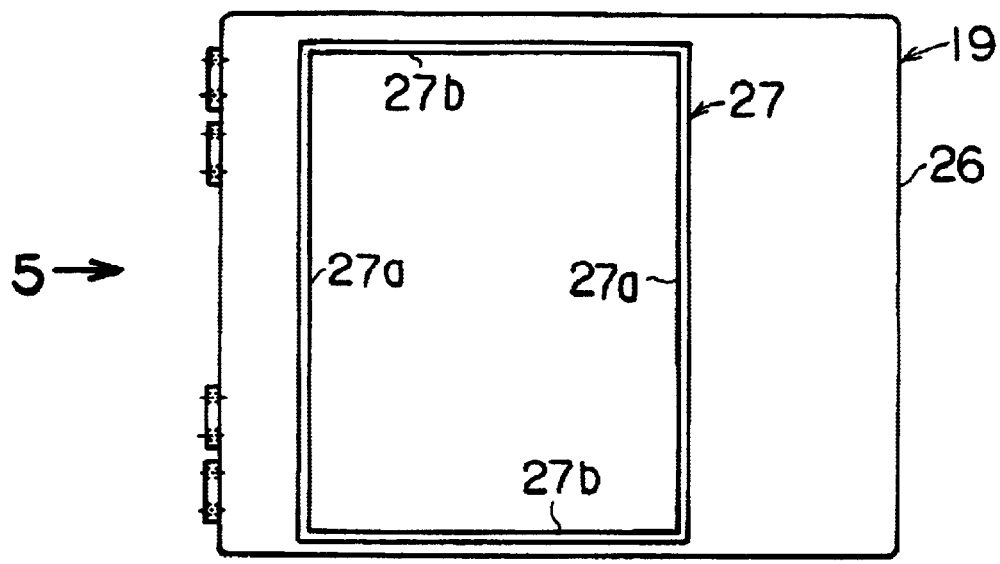
FIG. 4 is a plan view illustrating the back surface of a motherboard.
Figure 5:
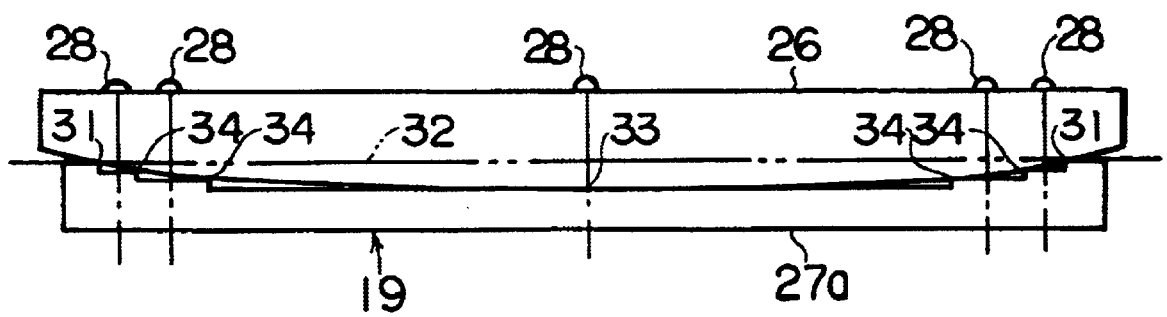
FIG. 5 is a side view of a printed circuit board unit observed in the direction of the arrow 5 in FIG. 4.

As shown in FIG. 4, the printed circuit board unit 19 includes a printed circuit board 26 comprising the multilayered copper printed circuit patterns, and a stainless correction member 27 attached to the back surface of the printed circuit board 26. The correction member 27 comprises four surrounding components 27a, 27b connected one another to form a rectangular frame. The correction member 27 is coupled to the printed circuit board 26 at spaced locations by couplers such as screws 28, as shown in FIG. 5, for example. As is apparent from a combination of FIGS. 1 and 4, the correction member 27 has a size enough to surround all the MCMs 17 on the opposite surface.

As shown in FIG. 5, the surrounding components 27a of the correct member 27 respectively comprise a pair of contact edges 31 contacting the back surface of the printed circuit board 26. The contact edges 31 define the contact points of the present invention. A support plane 33 and support edges 34 are arranged between the contact edges 31.

The support plane 33 and the respective support edges 34 contact the back surface of the printed circuit board 26 at positions withdrawing from a plane 32 including the contact edges 31. The contact and support edges 31, 34 are formed by steps facing the back surface of the printed circuit board 26. The support plane 33 and the support edges 34 define the support points of the present invention. When the printed circuit board 26 is urged against the support plane 33 and the support edges 34, the printed circuit board 26 may deform or bend. The screws 28 serve to maintain such deformation. It should be noted that a solder or an adhesive may replace the screws 28 so as to maintain the deformation of the printed circuit board 26.

The aforementioned printed circuit board unit 19 is designed to arrange the contact edges 31, the support plane 33 and the support edges 34 along a curved surface. When the printed circuit board 26 is urged against the contact edges 31, the support plane 33 and the support edges 34, the front surface of the printed circuit board 26 can be flattened. The input/output pads arranged on the front surface of the printed circuit board 26 reliably receive the corresponding input/output pins 24 of the MCMs 17 when the MCMs 17 are to be mounted on the printed circuit board 26. Failure in contact between the input/output pads and the input/output pins 24 can be avoided. In addition, if the printed circuit board unit 19 is cooled down after the unit 19 has been subjected to a high temperature atmosphere of 200–230 Celsius degrees in the process of soldering such as reflowing, the correction member 27 serves to restrain deformation of the cooled printed circuit board 26. Generation of a warp can be prevented in the printed circuit board 26. Furthermore, the correction member 27 of the printed circuit board unit 19 serves to prevent the printed circuit board 26 from deforming or warping because of its gravity during carriage.

Next, a brief description will be made on a method of producing the aforementioned printed circuit board unit 19. First of all, it is required to fabricate the printed circuit board 26 and the correction member 27 of predetermined shapes. When the printed circuit board 26 is to be fabricated, resin thin boards are prepared. Copper printed circuit patterns or films are formed on opposite surfaces, namely, front and back surfaces of the respective resin thin boards. The resin thin boards are superposed on one another while a half-cured or semifluid resin material is interposed between the resin thin boards. The superposed resin thin boards are then subjected to heat treatment. During heat treatment, pressure is applied to the superposed resin thin boards in the direction perpendicular to the surface of the boards. The half-cured resin material is completely cured to firmly join the resin thin boards to each other. Multilayered copper printed circuit patterns can be provided in this manner. Through holes may be formed in the resin thin boards so as to establish electric connection between the adjacent copper printed circuit patterns. The resin thin boards may be formed by impregnating glass fibers with fluid epoxy resin or polyimide.

Figure 6:
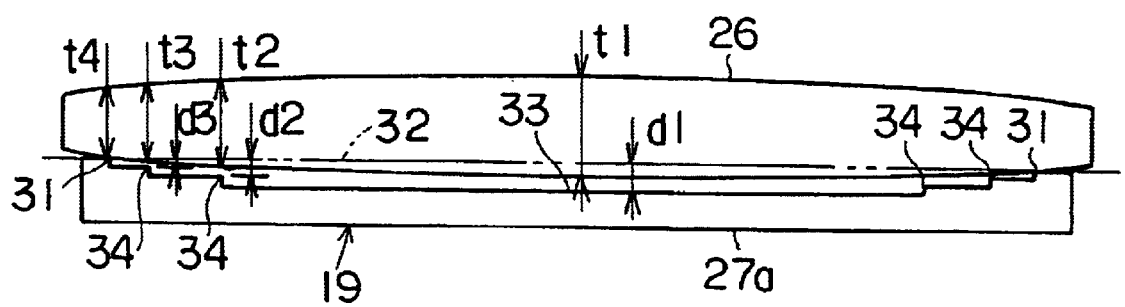
FIG. 6 is a side view illustrating a correction member and a printed circuit board decoupled from each other.

In heat treatment, the fused resin material designed to stay between the adjacent copper printed circuit patterns often leaks out at the periphery of the superposed resin thin boards. Such leakage of the fused resin material causes reduction in thickness at the periphery of the printed circuit board 26, as shown in FIG. 6. The reduction is gradually intensified toward the periphery. Curved surfaces are respectively formed at the front and back surfaces of the printed circuit board 26 so as to swell at the central area of the printed circuit board 26.

The prepared printed circuit board 27 is superposed on the correction member 27. Assume that the distances d1, d2, d3 are measured from the support plane and edges 33, 34 to the plane 32 including the contact edges 31. The measured distances d1, d2, d3 should respectively be set to reflect differences between the thickness t1, t2, t3 at the support plane and edges 33, 34 and the thickness t4 at the contact edges 31. As shown in FIG. 5, when the printed circuit board 27 is urged against the correction member 27 with the assistance of the screws 28, the back surface of the printed circuit board 27 is supported on the correction member 27 at the contact edges 31 and the support plane and edges 33, 34. According to the aforementioned distances d1, d2, d3, the front surface can be flattened in the printed circuit board 26.

In case where the printed circuit board unit 19 is supported at the periphery or opposite ends in a horizontal attitude during the process of reflowing, a warp may be generated in the printed circuit board 26 due to the gravity of the MCMs 17, the memory modules 18, both mounted on the printed circuit board 26, other electronic components mounted on the printed circuit board 26, the printed circuit board 26 itself and the correction member 27 itself. It is preferable to keep a proper curvature at the front surface of the printed circuit board 26 even after attachment of the correction member 27 so as to absorb or correct such warp caused by the gravity.

If the aforementioned printed circuit board unit 19 is employed in the process of reflowing for mounting the MCMs 17, the memory modules 18, and the other electronic components on the printed circuit board 26, the input/output pins of the respective electronic components reliably contact with the input/output pads on the printed circuit board 26. Electric connection can reliably be established between the electronic components and the copper printed circuit patterns. This has been confirmed. In addition, since a smaller difference can be found between the thermal expansion coefficient (=17 ppm/K) of the printed circuit board 26 and the thermal expansion coefficient (=17.6 ppm/K) of a stainless material JIS SUS303 for the correction member 27, a warp can be restrained to the utmost in the printed circuit board 26 even when the printed circuit board unit 19 is subjected to a high temperature atmosphere, of 250 Celsius degrees for example. It should be noted that the thermal expansion coefficient of the printed circuit board 26 may depend upon the types of the glass fibers and resin material and/or the volume or weight percentage of the resin material to the glass fibers.

The material for the correction member 27 may be selected from a group of materials having a thermal expansion coefficient enough to avoid failure in electric connection between the electronic components 17, 18 and the printed circuit board unit 19 when the correction member 27 is coupled to the printed circuit board 26 of a predetermined thermal expansion coefficient. However, in case where a larger difference can be found between the thermal expansion coefficients of correction member 27 and the printed circuit board 26, enlargement of bores receiving the screws 28 in the printed circuit board 26 may serve to absorb the difference in the thermal expansion or shrinkage between the correction member 27 and the printed circuit board 26. A clearance between the inner surface of the bore and the screw 28 allows the shift or relative movement between the correction member 27 and the printed circuit board 26 so as to absorb the difference in the thermal expansion or shrinkage.

Figure 7:
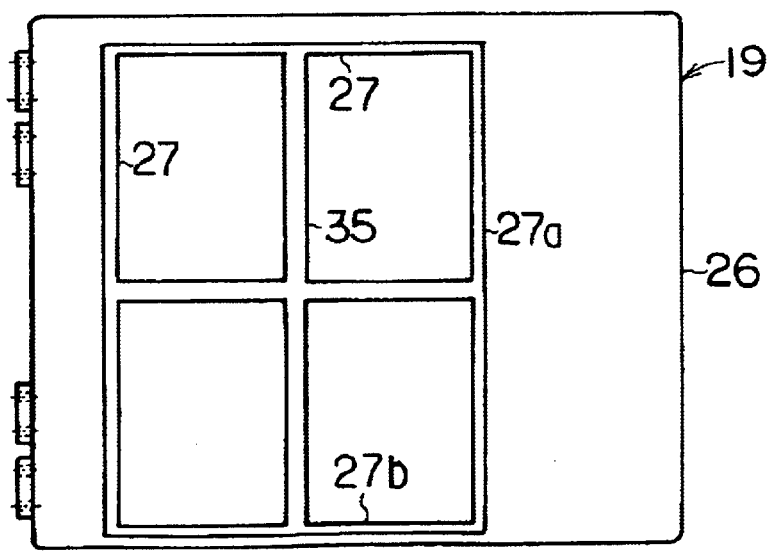
FIG. 7 is a plan view illustrating a modified embodiment of the correction member on the back surface of motherboard.

As shown in FIG. 7, the correction member 27 may further comprise a reinforcement component 35 formed into a cross shape so as to connect the opposite surrounding components 27a, 27b to each other at the middle. The reinforcement component 35 serves to increase the rigidity of the correction member 27. In addition, the reinforcement component 35 may serve to restrain a warp of the printed circuit board 26 if the printed circuit board 26 is coupled to the reinforcement component 35.

Figure 8:
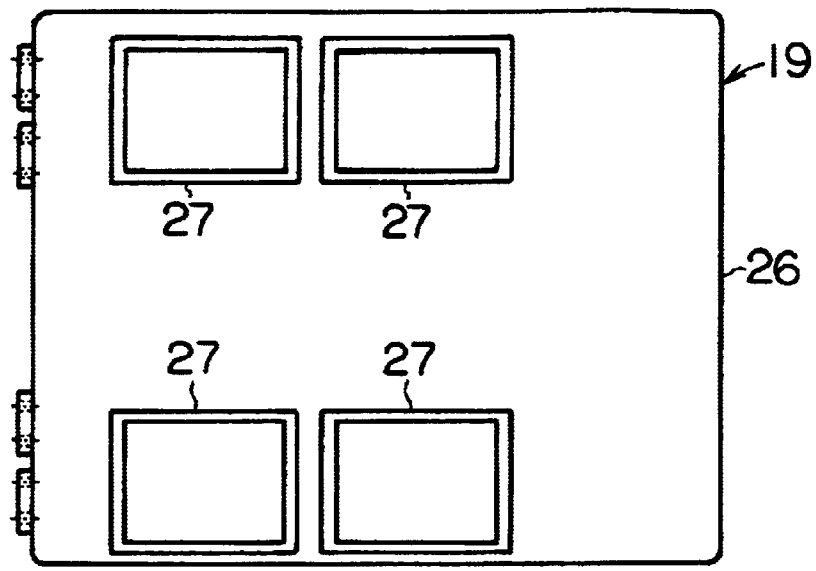
FIG. 8 is a plan view illustrating another modified embodiment of the correction member on the back surface of the motherboard.

As shown in FIG. 8, the correction member 27 may be formed by a size enough to surround the individual MCMs 17. In this case, the location of the contact edges 31 and the support plane and edges 33, 34 on the surrounding components 27a may be adjusted in accordance with the variation in thickness of the printed circuit board 26.

Figure 9:
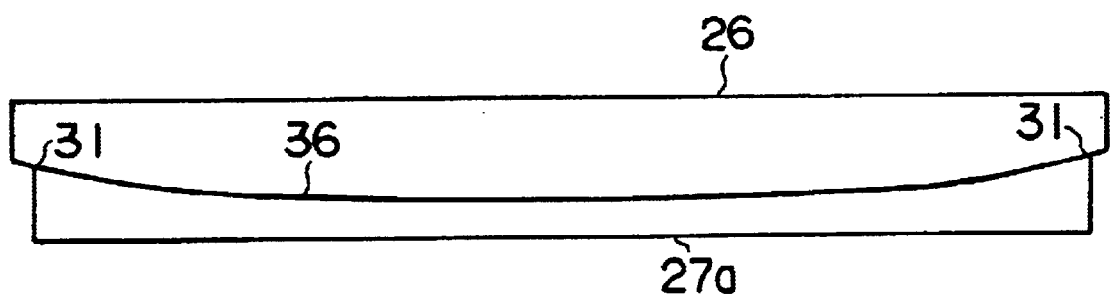
FIG. 9 is a side view of the printed circuit board unit for illustrating a further modified embodiment of the correction member.
Figure 10:
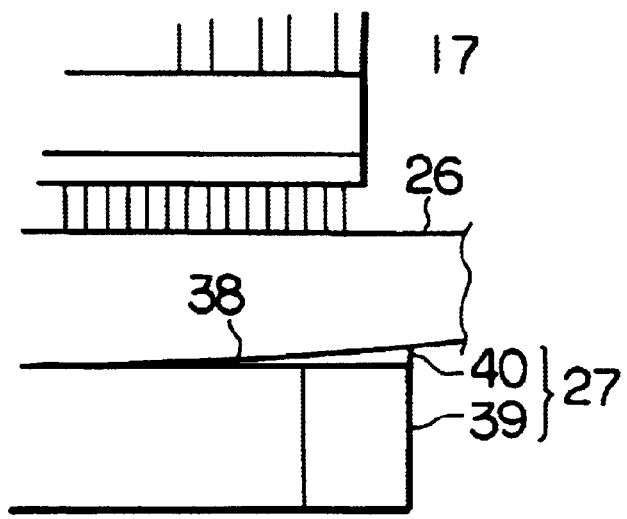
FIG. 10 is an enlarged side view of a part of the printed circuit board unit for illustrating a further modified embodiment of the correction member.

As shown in FIG. 9, a curved surface 36 may be formed to define the contact points and support points of the present invention in place of the contact edges 31, the support plane 33 and the support edges 34. Since the printed circuit board 26 is supported on the entire curved surface 36 in place of the edges 31, 34, the front surface of the printed circuit board 26 may be flattened with a higher dimensional accuracy. Otherwise, the correction member 27 may comprise, as shown in FIG. 10, a main body 39 with a flat surface 38 opposed to the back surface of the printed circuit board 26, and a filler 40 interposed between the printed circuit board 26 and the flat surface 38. The filler 40 serves to bend the printed circuit board 26. The correction member 27 of this type serves to achieve not only the aforementioned advantages but also employment of a conventional linear or planar member as the main body 39. The front surface of the printed circuit board 26 can be flattened without inducing a serious change in the design. The filler 40 may be formed of a rigid component or a filled resin material.

Figure 11:
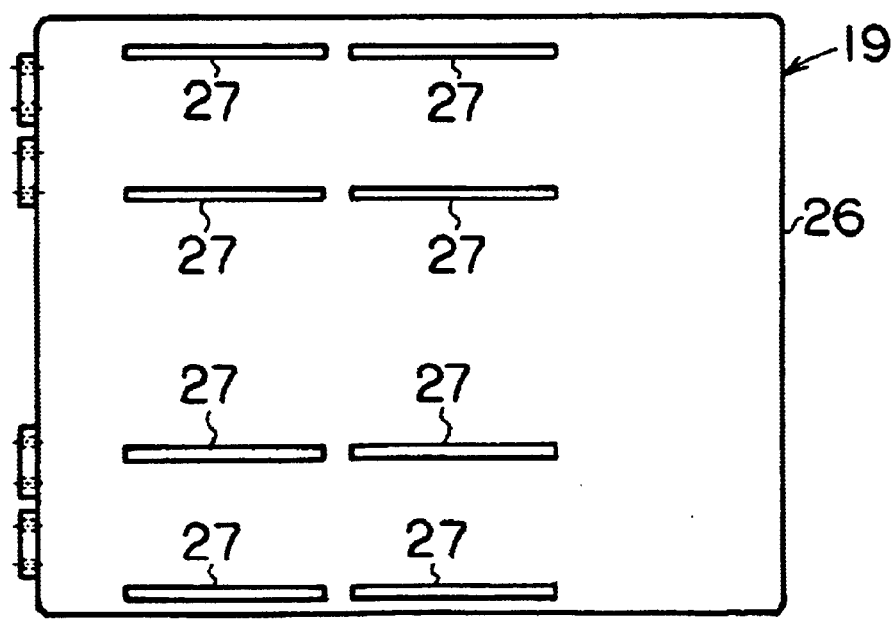
FIG. 11 is a plan view illustrating a further modified embodiment of the correction member on the back surface of the motherboard.

As shown in FIG. 11, the correction member 27 may also function as a power supply component. Such power supply component serves to provide a path for supplying electric voltage to the respective MCMs 17 in addition to electric paths 3provided by the copper printed circuit patterns. The correction member 27 of the type serves to increase the capacity of the electric paths leading to the respective MCMs 17, so that loss of electric voltage can be suppressed.

Figure 12:
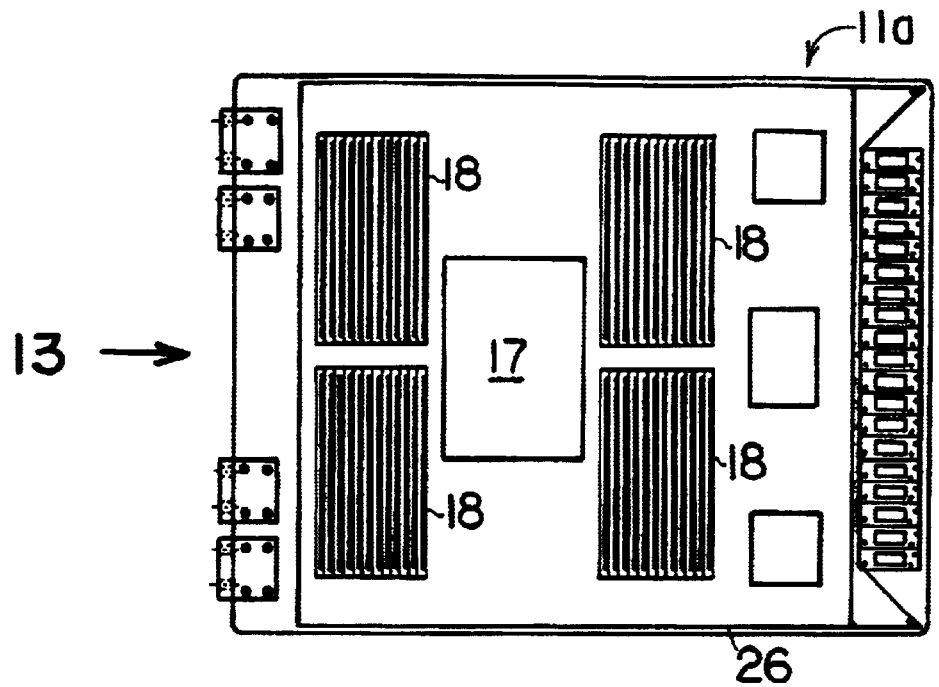
FIG. 12 is a plan view illustrating the front surface of a motherboard according to a second embodiment of the present invention.
Figure 13:
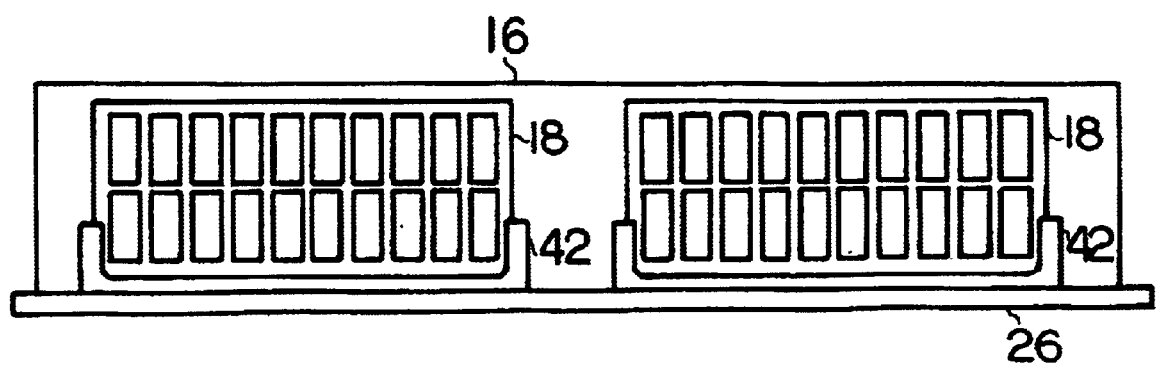
FIG. 13 is an enlarged side view of the motherboard observed in the direction of the arrow 13 in FIG. 12.

FIG. 12 illustrates a motherboard 11a according to a second embodiment of the present invention. The single MCM 17 is located on the printed circuit board 26 at the central area in the motherboard 11a. The memory modules 18 are located to surround the single MCM 17. As is apparent from FIG. 13, the respective memory modules 18 are mounted on the front surface of the printed circuit board 26 with the assistance of connectors 42.

Figure 14:
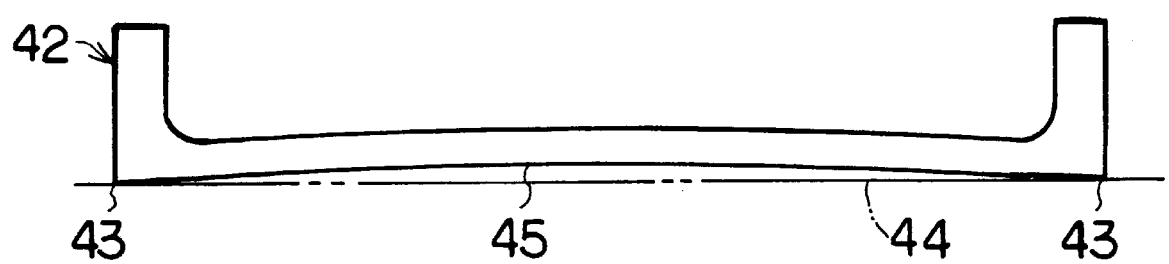
FIG. 14 is an enlarged front view illustrating a connector for a memory module.

The connector 42 comprises a pair of contact edges 43 contacting the front surface of the printed circuit board 26, as shown in FIG. 14. The contact edges 43 define contact points of the present invention. A curved surface 45 is formed on the connector 42 between the contact edges 43. The curved surface 45 defines support points contacting the back surface of the printed circuit board 26 at locations withdrawing from a plane 44 including the contact edges 43. A rigid component such as a metallic component, not shown, may be embedded in the resinous connector 42 so as to maintain the curvature of the curved surface 45.

When the printed circuit board 26 is coupled to the connector 42 by means of a coupler such as screws or an adhesive, the printed circuit board 26 is urged against the curved surface 45 of the connector 42. The connector 42 induces a slight warp of the printed circuit board 26. The front surface of the printed circuit board 26 is designed to swell at the central area. When the printed circuit board 26 is supported at the periphery or opposite ends in a horizontal attitude in the process of reflowing, a warp may be generated in the printed circuit board 26 due to the gravity of the MCMs 17, the memory modules 18, and other electronic components mounted on the printed circuit board 26, as well as the gravity of printed circuit board 26 itself. If the connectors 42 are mounted on the printed circuit board 26 prior to the process of reflowing, the intentional warp induced by the connectors 42 may serve to cancel a warp or deformation generated by the support at the periphery or opposite ends. The front surface of the printed circuit board 26 can be maintained flat during the process of reflowing. The MCMs 17, memory modules 18, and the other electronic components mounted on the printed circuit board 26 reliably allow the input/output pins to contact the input/output pads on the printed circuit board 26. Electric connection can reliably be established between the mounted electronic components and the copper printed circuit pattern in the printed circuit board 26.

What is claimed is:

1. A printed circuit board unit comprising:
   a printed circuit board, the thickness of the printed circuit board being reduced near a periphery of the printed circuit board; and
   a correction member including a pair of contact portions and a support portion arranged between the contact portions, said support portion being located at a position withdrawing from a plane including the contact portions.

2. A printed circuit board unit comprising:
   a printed circuit board;
   a correction member including a pair of contact portions and a support portion arranged between the contact portions, said support portion being located at a position withdrawing from a plane including the contact portions;
   first couplers coupling the correction member with the printed circuit board at the contact portions; and
   a second coupler coupling the correction member with the printed circuit board at the support portion.

3. The printed circuit board unit according to claim 2, wherein a distance between the support portion and the plane is set to reflect an amount of shift generated at the support portion when the printed circuit board and the correction member are supported at periphery in a horizontal attitude.

4. The printed circuit board unit according to claim 3, wherein the correction member contacts a back surface of the printed circuit board at the contact and support portions so as to correct a curvature of a front surface of the printed circuit board.

5. The printed circuit board unit according to claim 4, wherein a distance measured from the support portion and the plane is set to reflect a difference between a thickness of the printed circuit board at the support portion and a thickness of the printed circuit board at the contact portion.

6. The printed circuit board unit according to claim 5, wherein the support portion is positioned on a curved surface formed on the correction member.

7. The printed circuit board unit according to claim 6, wherein the correction member comprises a main body with a flat surface opposed to the printed circuit board, and a filler interposed between the main body and the printed circuit board so as to induce a bend of the printed circuit board.

8. The printed circuit board unit according to claim 5, wherein the support portion is positioned at an edge of a step formed on the correction member.

9. The printed circuit board unit according to claim 2, wherein the correction member is formed into a frame.

10. A correction member unit for a printed circuit board, including:
- a correction member including at least three support portions arranged on a curved virtual plane; and
- a coupler coupled to the correction member at a predetermined one of the support portions, said predetermined one of the support portions being set between pairs of the support portions.

11. A correction member unit for a printed circuit board comprising:
- a correction member including a pair of contact portions and a support portion arranged between the contact portions, said support portion being located at a position withdrawing from a plane including the contact portions;
- first couplers coupled to the correction member at the contact portions; and
- a second coupler coupled to the correction member at the support portion.

12. The correction member unit according to claim 11, wherein the support portions is positioned on a curved surface formed on the correction member.

13. The correction member unit according to claim 11, wherein the support portion is positioned on an edge of a step.

14. The correction member unit according to claim 11, wherein a material of the correction member is selected to reflect a thermal expansion coefficient of a printed circuit board to be coupled to the correction member.

15. The correction member unit according to claim 14, wherein the material is a stainless steel.

16. The correction member unit according to claim 11, wherein the correction member is integrated with a power supply member.

17. The correction member unit according to claim 11, wherein the correction member is integrated with a connector.

* * * * *